United States Patent [19]

Takai et al.

[11] Patent Number: 4,549,282
[45] Date of Patent: Oct. 22, 1985

[54] MAGNETIC BUBBLE MEMORY SYSTEM

[75] Inventors: Sakan Takai, Kawasaki; Takenori Iida, Yokohama; Keiichi Kaneko, Kawasaki, all of Japan

[73] Assignee: Fujitsu Limited, Kawasaki, Japan

[21] Appl. No.: 558,476

[22] Filed: Dec. 6, 1983

[30] Foreign Application Priority Data

Dec. 6, 1982 [JP] Japan .................. 57-212757

[51] Int. Cl.$^4$ .................................. G11C 19/08
[52] U.S. Cl. .................................. 365/1; 365/15
[58] Field of Search ........... 365/1, 15; 364/200, 364/900

[56] References Cited

U.S. PATENT DOCUMENTS

3,999,172 12/1976 Bhandarkar .................. 365/15
4,161,788 7/1979 Rosenblum .................... 365/15
4,433,387 2/1984 Dyer et al. ..................... 364/900

Primary Examiner—James W. Moffitt
Attorney, Agent, or Firm—Staas & Halsey

[57] ABSTRACT

A magnetic bubble memory system includes a plurality of magnetic bubble devices, each of which has at least one minor loop for storing magnetic bubbles, at least one information transfer gate and replicator. Also included in the system are at least one page-allocation designating circuit provided for a corresponding magnetic bubble device for designating single-page or multi-page mode of access and a control-signal generating circuit which outputs a signal controlling the information transfer and replicator gates in cooperation with the output from the page-allocation designating circuit.

9 Claims, 27 Drawing Figures

MAGNETIC BUBBLE MEMORY SYSTEM

BACKGROUND OF THE INVENTION

1. Field of the Invention

The present invention relates to a magnetic bubble memory system, more particularly to a major-minor loop construction magnetic memory system in which access in a single-page mode or a multi-page mode can be selected for each magnetic bubble device in the system.

2. Description of the Prior Art

In general, there are two types of constructions used in magnetic bubble memory systems: single-loop construction and major-minor loop construction. In major-minor loop type magnetic bubble memory systems, there are two access methods: a single-page mode in which single pages are accessed in a minor loop in the magnetic bubble device and a multi-page mode in which two or more pages are accessed in a minor loop in the magnetic bubble device based on one access command.

Magnetic bubble memory systems include one or more magnetic bubble devices, each of which has several bubble storage minor loops. In the prior art magnetic bubble memory systems, however, only one of the above access methods can be used for the devices at one time, i.e., all of the magnetic bubble devices are uniformly accessed in either the single-page or multi-page mode. When a magnetic bubble memory system is set for access in the single-page mode, the response of bubble devices intended for access in the multi-page mode is slow. When the system is set for multi-page mode access, the response of bubble devices intended for single-page mode access is slow. This means the prior art magnetic bubble memory systems cannot provide the optimum overall response.

SUMMARY OF THE INVENTION

An object of the present invention is to provide a major-minor loop construction magnetic bubble memory system in which single-page mode or multi-page mode can be selected independently for each magnetic bubble device in the system.

The above object of the present invention can be obtained using the following techniques: (a) allocate pages in the minor loops in each bubble memory device for access in the single-page mode or multi-page mode, (b) include an access-mode-designating circuit for each bubble memory device, and (c) construct a control circuit which operates a signal for controlling both modes of access in response to a signal from one of the access-mode-designating circuits.

According to the present invention, there is provided a magnetic bubble memory system which includes a plurality of magnetic bubble devices, each of which includes at least one minor loop to store magnetic bubbles, at least one information storage gate for transferring magnetic bubbles on a storage major line to a corresponding minor loop and at least one information read gate for reading the magnetic bubbles from the corresponding minor loops to a read major line, and in which each of the minor loops has a predetermined bit length. Also included in the system is at least one page-allocation-designating circuit, which is provided for a corresponding magnetic bubble device and designates a single-page mode or a multi-page mode for page allocation in the corresponding magnetic bubble device. Finally, a control-signal-generating circuit is included which generates a signal for controlling the transfer of the magnetic bubbles in the minor loop, the information storage gates and the information read gates in response to the page allocation designated by the page-allocation-designating circuit for the corresponding magnetic bubble device accessed in the single-page mode or the multi-page mode.

BRIEF DESCRIPTION OF THE DRAWINGS

Other objects and features of the present invention will be more clearly understood with reference to the accompanying drawings, in which.

DESCRIPTION OF THE PREFERRED EMBODIMENT

Figure 1:
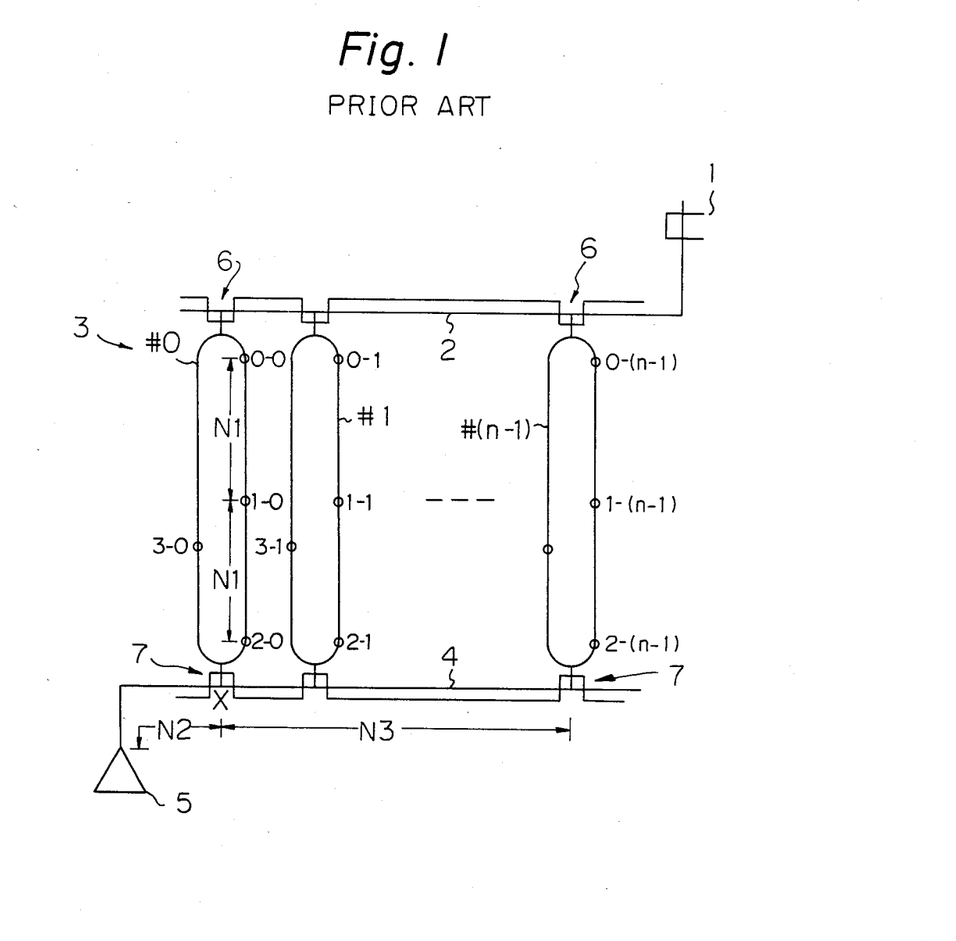
FIG. 1 is a block diagram of a prior art bubble memory system.

Before describing a preferred embodiment of the present invention, an explanation will be given of the prior art for comparison. FIG. 1 illustrates a prior art magnetic bubble device construction having major loops and minor loops. In FIG. 1, the magnetic bubble device includes storage loop 3 consisting of several minor loops #0 to #(n−1), each of which stores information in the form of a magnetic bubble, a storage major line 2, and a read major line 4.

Information is stored in the minor loops of the bubble device when a generator 1 generates magnetic bubbles under the command of a control circuit (not shown in FIG. 1). The generated magnetic bubbles corresponding to one page are transferred to the storage major line 2 and stored in the minor loops #0 to #(n−1) through transfer gates (information storage gates) 6. The above transfer of the magnetic bubbles is performed by a rotational magnetic field formed by two perpendicularly intersecting coils (not shown in FIG. 1).

Information is read when replicator gates (information read gates) 7 reproduce the magnetic bubbles in each minor loop on the read major line 4. The magnetic bubbles transferred onto the read major line 4 are then detected by a detector 5.

As mentioned earlier, the storage loop 3 consists of a plurality of n minor loops #0 to #(n−1), each of which has N bits. One page, for example page 00 consists of "0—0" in loop #0 to "0−(n−1)" in loop #(n−1), i.e., one page has n bits. Therefore, the total storage capacity of the storage loop 3 is n·N bits. In FIG. 1, the portion of the minor loop #0 between the numerals 0—0 and 1-0 contains $N_1$ bits. Other portions having the same length similarly contains $N_1$ bits. The other minor loops #1 to #(n−1) feature the same construction.

The portion of the read major line 4 from point X to the detector 5 corresponds to $N_2$ bits. In this portion of the read major line 4, the magnetic bubbles can be transferred and enlarged. In addition, the portion of the read major line 4 between the replicator gate 7 for the minor loop #0 and the replicator gate 7 for the loop #(n−1) is $N_3$ bits. In the illustrated example of the prior art, $N_1$ is 580 bits, $N_2$ is 100 bits, and $N_3$ equals $N_1$.

Below, the read operation of the prior device art will be explained with reference to FIGS. 2a to 2d and 3a to 3c for the case in which all of the data in the minor loops #0 to #(n−1) are read in the multi-page mode. FIGS. 2a to 2d show only the minor loop #0. FIG. 3a illustrates a magnetic bubble transfer signal which is high during the transfer operation. FIG. 3b illustrates the transfer bits, and FIG. 3c illustrates the pages to be read.

Figures 2A, 2B:
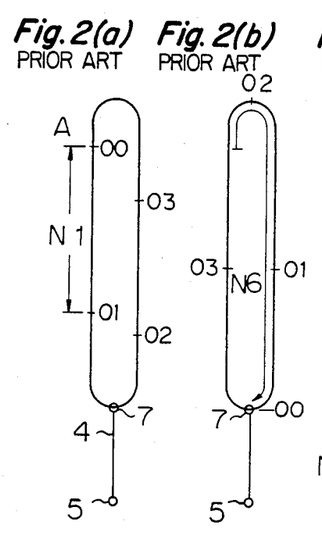
FIGS. 2a to 2d depict the bubble transfer in the minor loop in FIG. 1 during a multi-page mode access.
Figures 2C, 2D:
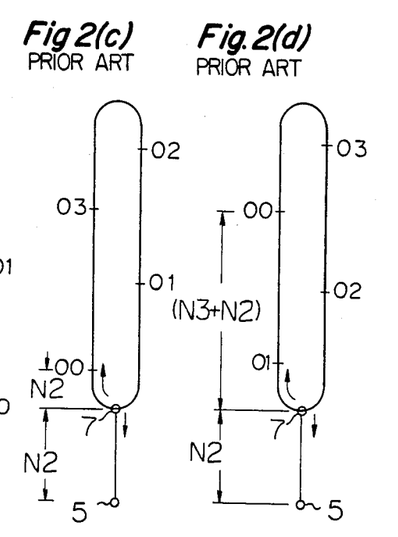
Figures 3A, 3B:
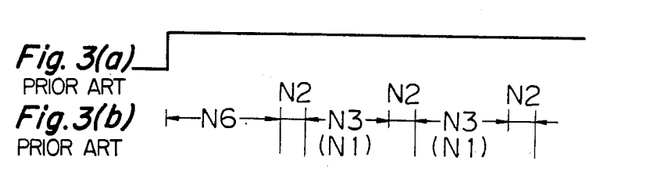
FIGS. 3a to 3c are timing charts of the bubble transfer depicted in FIG. 2.

Assuming the first address of the page is positioned at point A as illustrated in FIG. 2a, the magnetic bubbles in the loop #0 are circulated in the loop for $N_6$ bits until the first address reaches the replicator gate 7 (FIG. 2b). The magnetic bubbles of page 00 in loop #0 are reproduced at the replicator gates 7 and then transferred on the major line 4 for $N_2$ bits. When the first reproduced bubble from "0—0" in the loop #0 reaches the detector 5, the read operation starts (FIG. 2c). The reproduced magnetic bubbles from the other loops #1 to #(n−1) are then continuously shifted by $N_3$ bits on the major line 4 until all of the bits in page 00 are read. During the above operation, the magnetic bubbles in the minor loops are circulated in their loops.

When the bubble output from the loop #(n−1) reaches the replicator gate 7 of the loop #0, the first bit of page 01 (in the loop #0) has already reached the replicator gate 7 of the loop #0 (FIG. 2d). Thereafter, the bubbles of page 01 are also subjected to replication and read-out. The succeeding pages are read in a manner similar to that described above.

Figure 3C:
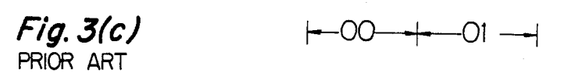

As mentioned above, when all of the storage data in the minor loops is read in the multi-page mode, a time-consuming initial transfer of $N_6$ bits is needed for each of the minor loops, however, there is no delay between pages within a loop as illustrated in FIGS. 3a to 3c. In other words, the multi-page mode access decreases the total access time when the access operation is over two pages.

Figure 4A:
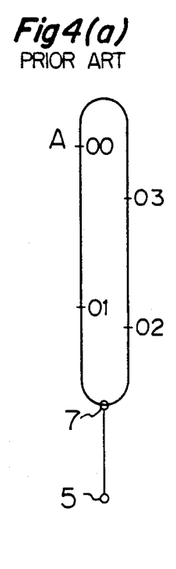
FIGS. 4a to 4d depict the bubble transfer in the minor loop in FIG. 1 during a single-page mode access.
Figure 4B:
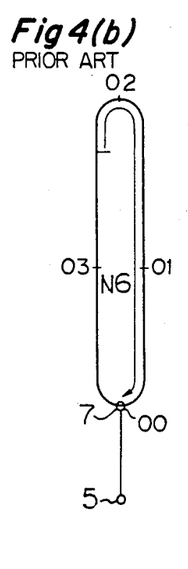
Figure 4C:
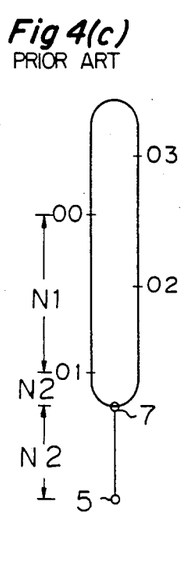
Figure 4D:
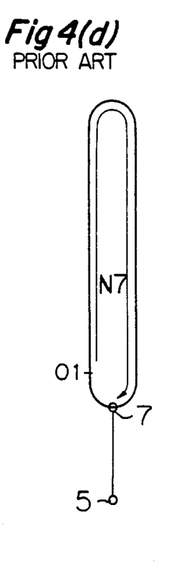
Figures 5A, 5B:
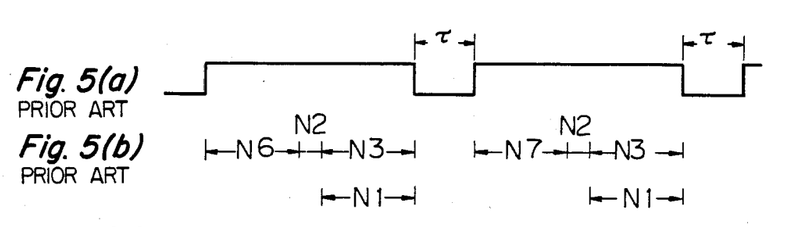
FIGS. 5a to 5c are timing charts of the bubble transfer depicted in FIG. 4.
Figure 5C:
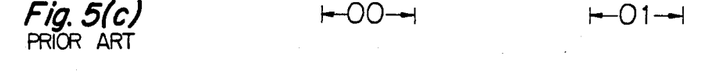

Next, the read operation of the prior art will be explained with reference to FIGS. 4a to 4d and 5a to 5c for the case where all of the data in the minor loops is read in the single-page mode. FIGS. 4a to 4d are similar to FIGS. 2a to 2d, and FIGS. 5a to 5c are similar to FIGS. 3a to 3c. The initial condition of the pages in the loop #0 in FIG. 4a is the same as that in FIG. 2a. When a read command for page 00 is generated, the initial $N_6$ bit transfer of the bubbles is effected so that the first bit of the page 00 reaches the replicator gate 7 for loop #0 (FIG. 4b). The $N_2$ bits of the magnetic bubbles are then transferred further so that the first bit of page 00 reaches the detector 5. At that point, the read operation of page 00 starts. The bubbles are then continuously transferred for $N_3$ bit until the read operation of page 00 is completed.

Since the single-page mode access is used in FIGS. 4 and 5, the transfer of the magnetic bubbles is terminated when page 00 is completely read. At that time, the starting address of page 01, which has not yet been transferred onto the read major line 4, has advanced to the point $N_2$ bits past the replicator gate 7 of the minor loop #0 (FIG. 4c). When the read command to page 01 occurs after the time $\tau$ from the completion of the page 00 read-out, the starting address of page 01 must be circulated by $N_7=(N-N_2)$ bits before the read operation can be effected (FIG. 4d). The read operation of the succeeding pages is accomplished in a similar manner.

As understood from the above, when the loop condition is set to $N_1=N_3$ to improve the access time and the transfer rate in the multi-page mode, it takes more time to read several pages in the single-page mode than it takes to read those pages in the multi-page mode because there is idle time $\tau$ and the time required for circulation of $N_7$ bits for every page accessed. The same disadvantage is true for a storage operation in the single-page mode.

Figure 6:
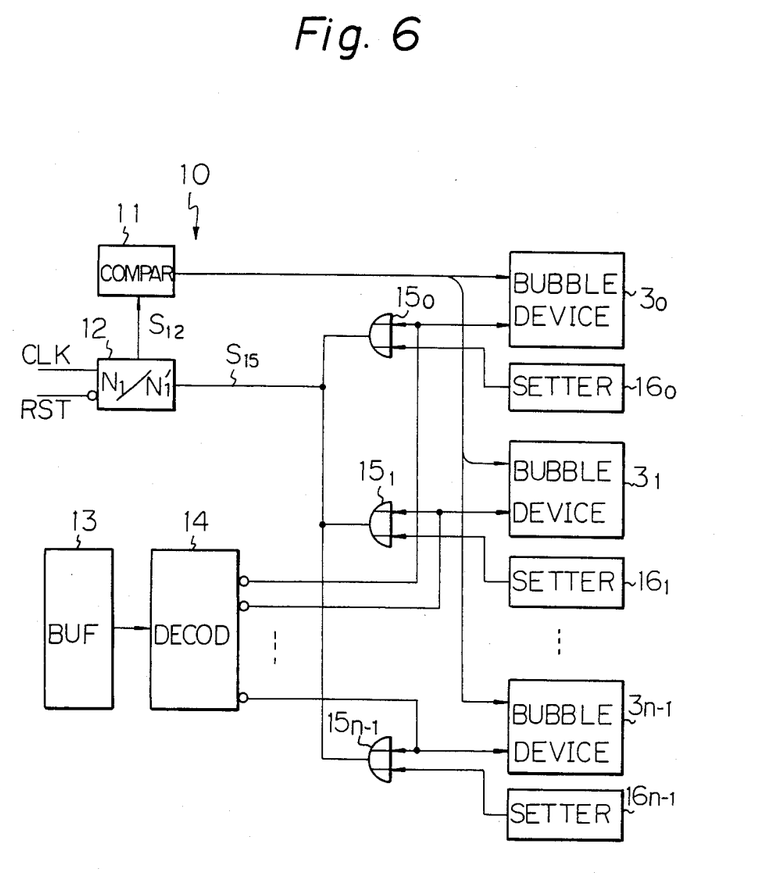
FIG. 6 is a circuit diagram of a bubble memory system in accordance with an embodiment of the present invention.

An embodiment according to the present invention will now be described with reference to FIG. 6. In FIG. 6, each magnetic bubble device $3_0$ to $3_{n-1}$ includes minor loops #0 to #(n−1) and a linear circuit. A control circuit 10 comprises a coincidence circuit 11, a variable counting circuit 12, a device-setting buffer 13, a decoder 14, OR gates $15_0$ to $15_{n-1}$, and page-allocation-designating circuits (setter) $16_0$ to $16_{n-1}$. The control circuit 10 includes additional circuits, which, however, do not concern the present invention and are therefore not illustrated.

In the present invention, access to the magnetic bubble devices is classified into the following three categories based upon the application for which it is used:

A. Incremental accessing of a single page or a few pages, for example, when the bubble device is used for data logging, B. Random accessing of a single page, for example, when the bubble device is used for a file memory or for general data processing, and C. Multi-page continuous access, for example, when the bubble device is used for an initial program loader or for storage of sequential data.

When the above access modes are requested simultaneously in a bubble memory system, one of the above modes is selected for each magnetic bubble device $3_0$ to $3_{n-1}$. The mode is selected by the page-allocation-designating circuits (setter) $16_0$ to $16_{n-1}$ for the corresponding magnetic bubble devices. The incremental mode is selected for the device $3_0$, the random mode for the device $3_1$, and the multi-page continuous mode for the device $3_{n-1}$, therefore, the page-allocation-designating circuits (setter) $16_0$ and $16_{n-1}$ are set to low "L" and the circuit $16_1$ to high "H". The circuits $16_0$, to $16_{n-1}$ are set prior to the storage of data into the devices $3_0$ to $3_{n-1}$ by manual operation of mechanical switches in the circuits $16_0$ to $16_{n-1}$, automatic operation from a computer of, for example, transistors, or other appropriate means.

The outputs of the designating circuits $16_0$ to $16_{n-1}$ are applied to one input terminal of the OR gates $15_0$ to $15_{n-1}$, respectively. The other input terminals of the OR gates $15_0$ to $15_{n-1}$ receive signals from the decoder 14. The outputs of the OR gates $15_0$ to $15_{n-1}$ are applied to the variable counter circuit 12, which forms a part of a control-signal generating circuit transmitting signal controlling the transfer gates and the replicator gates in the bubble devices.

Figure 7:
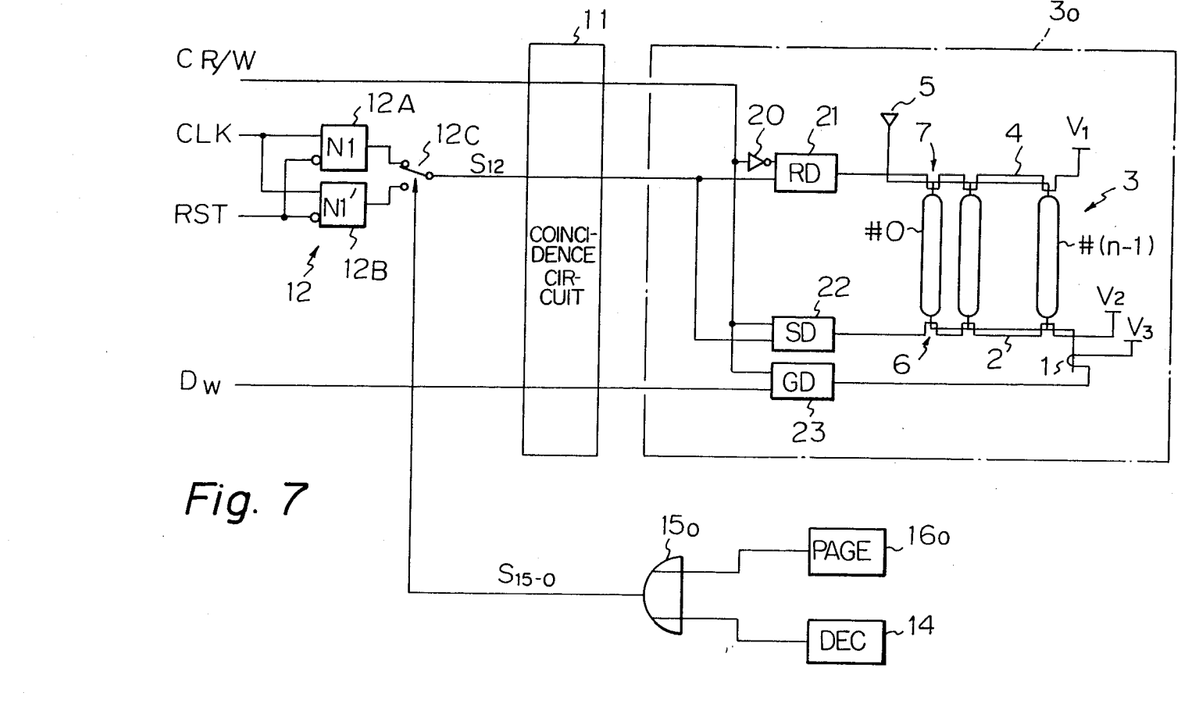
FIG. 7 is a detailed circuit diagram of the counter circuit, bubble device, and page-allocation-designating circuit in FIG. 6.

FIG. 7 is a detailed diagram of the counter circuit 12, device $3_0$, OR gate $15_0$, and designating circuit $16_0$. The device $3_0$ includes a replicator driver circuit (RD) 21 and a swap gate driver circuit (SD) 22. These driver circuits 21 and 22 are connected to the read major line 4 and the storage major line 2, respectively. The write or read signal $C_{R/W}$ passes through the coincidence circuit 11 to the replicator driver circuit 21 with an inverter 20 and to the swap gate driver circuit 22. As a result, one of the circuits 21 and 22 is activated in response to the signal $C_{R/W}$. The device $3_0$ further includes a generator driver circuit (GD) 23 for activating the magnetic bubble generator 1 in accordance with write data $D_W$ when the signal $C_{R/W}$ has a write status. Reference symbols $V_1$ to $V_3$ in the device $3_0$ represent the operation voltages.

The counter circuit 12 comprises two counters 12A and 12B and a switching element 12C. The counters 12A and 12B receive a clock signal CLK and output control signals having $P_1$ pulses and $P_1'$ pulses, where $P_1$ pulse correspond to transferring $N_1$ bits of the bubbles and $P_1'$ pulses corresponds to transferring $N_1'$ bits of the bubbles. The control signal S12 is selected from the counters 12A and 12B by the switching element 12C, i.e., the control signal S12 has $P_1$ pulses when the output of the OR gate $15_0$ is high and has $P_1'$ pulses when the output is low. The control signal S12 is applied to driver circuits 21 to 22. The "RST" signal is a reset signal for the counters 12A and 12B. In this embodiment, $P_1=580$ pulses ($N_1=580$ bits), $P_2=100$ pulses ($N_2=100$ bits) and $P_1'=P_1+P_2=680$ pulses ($N_1'=N_1+N_2=680$ bits).

Figures 8A, 8B:
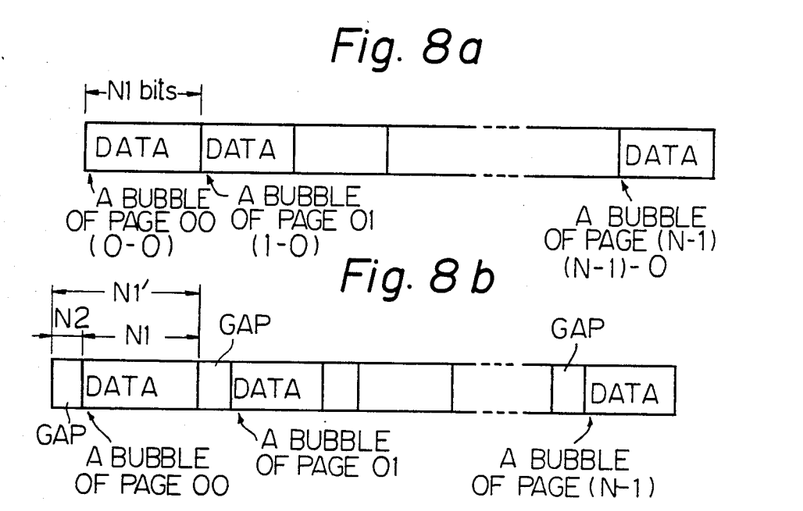
FIGS. 8a and 8b are page allocations for the multi-page mode and single-page mode in accordance with the present invention, respectively.

FIGS. 8a and 8b illustrate page allocations in a minor loop. FIG. 8a is an allocation adaptable to a multi-page mode access and consists of consecutive pages. The distance between a bit of page 00 and a bit of page 01 contains $N_1$ bits of DATA for other pages. FIG. 8b is an allocation adaptable to a single-page mode access. It also stores multiple pages, but there are additional $N_2$ bit gaps (GAP).

The operation of the bubble system of FIG. 6 in accordance with the present invention will now be described. When the device buffer 13 outputs a signal to the decoder 14 to access one of the bubble devices, the decoder 14 outputs a gate signal, which is low when a magnetic bubble device is to be selected, to the OR gate $15_X$ (X:0 to n−1) of the corresponding bubble device $3_X$. Thus, the bubble device to be accessed and the access mode thereof are determined.

First, the read operation of the magnetic bubble device $3_1$ will be explained. As mentioned above, the multi-page mode is used for accessing the device $3_1$ and the output of the page-allocation-designating circuit $16_1$ is high. Therefore, the output of OR gate $15_1$ is high, and the output of the counter circuit 12 has $P_1$ pulses for transferring 580 bits. The pulses output by the counter circuit 12 are applied to the driver circuits 21 to 22 in the device $3_1$ through the coincidence circuit 11 and control the transfer of the bubbles on the read major line 4 and the transfer of the bubbles in the minor loops #0 to #(n−1). This operation is similar to that of the prior art device in the multi-page mode. Therefore, the bubble device $3_1$ is accessed under the most effecient conditions.

Figure 9A:
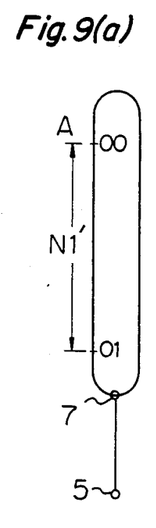
FIGS. 9a to 9d depict show the transfer of bubbles in the minor loop under a read operation in accordance with the present invention.
Figure 9B:
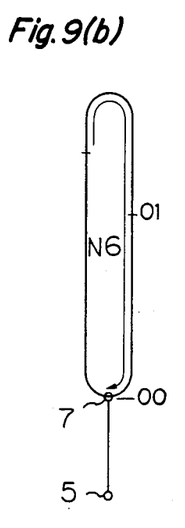
Figure 9C:
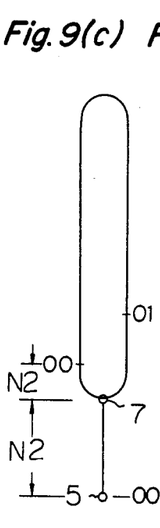
Figure 9D:
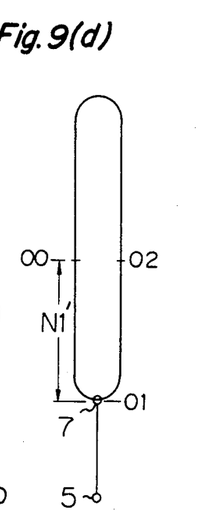

Next, the read operation of the bubble device $3_0$ will be explained. As mentioned above, the single-page mode is used for the device $3_0$ and the output of the page-allocation-designating circuit $16_0$ is low. Therefore, the output of OR gate $15_0$ is low, and the output of the counter circuit 12 has $P_1'$ pulses for transferring 680 bits. The device $3_0$ is activated by this signal. Assume the initial condition of the minor loops in the device $3_0$ is that of FIGS. 2 and 4, that is, the start address of the page 00 in minor loop #0 is at point A as illustrated in FIG. 9a. Upon issuance of the access command, the magnetic bubbles in the minor loops are circulated by $N_6$ bits, positioning the start address for page 00 at the replicator gate 7, as illustrated in FIG. 9b. The magnetic bubbles are then tranferred by $N_2$ bits so that the first bubble 0—0 reaches the detector 5. At that point, the read operation of the magnetic bubbles starts as illustrted in FIG. 9c. Since the distance between pages 00 and 01 is allocated as shown in FIG. 8b, the read operation of the page 00 will be completed by a transfer of $N_1'$ bits.

Figures 10A, 10B, 10C:
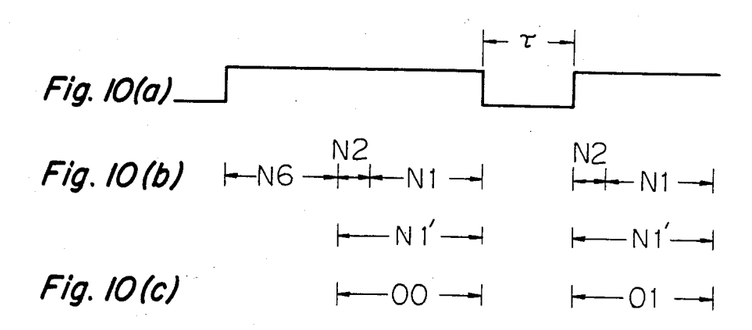
FIGS. 10a to 10c are timing charts of FIGS. 9a to 9d.

FIGS. 10a to 10c are timing charts of the above operation. FIG. 10a illustrates a magnetic bubble transfer signal, which is high during the transfer, FIG. 10b illustrates the number of bubbles transferred, and FIG. 10c illustrates the pages read.

In the single-page mode, the page allocation is set to $N_1'=N_1+N_2$. Therefore, the start address of page 01 is positioned at the replicator gates 7, i.e., does not pass the replicator gates 7 (FIG. 10d), as in the prior art. Therefore, when the next access request is generated after the time τ from the completion of the previous read operation, the next read operation can be performed without the wasted $N_7$ bit transfer of the prior art system. In other words, the operation time can be reduced by the time necessary for transferring an extra $N_7$ bits for every page access. The read operation of the device $3_{n-1}$ uses the single-page mode, therefore it is similar to that of the device $3_0$ mentioned above. A write operation in all of the magnetic bubble devices is performed in a manner similar to the read operation.

Figure 11:
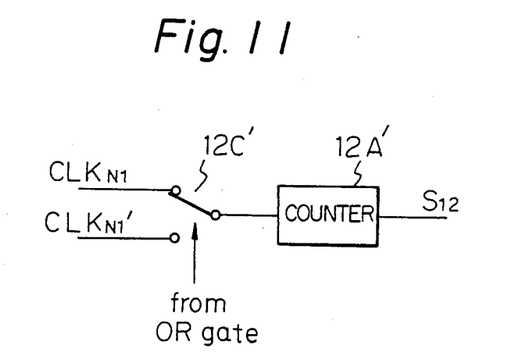
FIG. 11 is another embodiment of the counter circuit in FIG. 7.

In the above embodiment, the variable counter circuit 12 comprises two different counters 12A and 12B which receive the same clock pulse. Various modifications of the counter circuit 12 are possible, however. For example, as illustrated in FIG. 11, the counter circuit 12 can be constructed of one counter 12A'. One of two different clock signals $CLK_{N1}$ and $CLK_{N1'}$ can be applied by a switching element 12C' in response to the output from the one OR gates $15_x$. In this case, the clock signals $CLK_{N1}$ and $CLK_{N1'}$ would have predetermined frequencies to output $P_1$ pulses or $P_1'$ pulses from the counter 12A'.

According to the present invention, access by single-page mode and multi-page mode can be selected for each bubble device in the bubble memory system in in accordance with the application. Thus, the operation time of the system can be reduced.

We claim:

1. A magnetic bubble memory system, comprising:
   a plurality of magnetic bubble devices, each comprising:
   at least one minor loop, having a predetermined bit length, for storing magnetic bubbles;
   storage and read major lines for transporting the magnetic bubbles;

at least one information storage gate, between the storage major line and a corresponding minor loop, for transferring the magnetic bubbles from the storage major line to the corresponding minor loop; and at least one information read gate, between the corresponding minor loop and the read major line, for reading the magnetic bubbles from the corresponding minor loop to the read major line;

at least one page-allocation-designating means, corresponding to each of said magnetic bubble devices, for designating page allocation for accessing in one of a single-page mode and a multi-page mode each of said magnetic bubble devices; and control-signal-generating means, operatively connected to said magnetic bubble devices and said page-allocation-designating means, for generating a signal which controls the transfer of the magnetic bubbles in the minor loop, the information storage gate and the information read gate in dependence upon the page allocation designated by said page-allocation-designating means for accessing the corresponding magnetic bubble device in the appropriate one of the single-page mode and the multi-page mode.

2. A magnetic bubble memory system according to claim 1, wherein said page-allocation-designating means designates page allocation for one of the single-page mode and the multi-page mode for each of said magnetic bubble devices in said magnetic bubble memory system.

3. A magnetic bubble memory system according to claim 2, wherein said control-signal-generating means generates a first signal having $P_1+P_2$ pulses for said magnetic bubble devices accessed in the single-page mode and a second signal having $P_1$ pulses for said magnetic bubble devices accessed in the multi-page mode, where $P_1$ corresponds to a transfer of a first number of the magnetic bubbles equal to one page and $P_2$ corresponds to a transfer of a second number of the magnetic bubbles required to output all of the magnetic bubbles of one page.

4. A magnetic bubble memory system according to claim 3, wherein said control-signal generating means comprises:

a first control-signal generating circuit, operatively connected to said magnetic bubble devices and said page-allocation designating means, for generating the first signal for the single-page mode; and a second control-signal generating circuit, operatively connected to said magnetic bubble devices and said page-allocation-designating means, for generating the second signal for the multi-page mode, one of the first and second signals of said first and second control-signal generating circuits being output in dependence upon the page-allocation designated by said page-allocation-designating means.

5. A magnetic bubble memory system according to claim 3, operatively connected to receive first and second clock signals, wherein said control-signal generating means comprises:

a control-signal generating circuit, operatively connected to said magnetic bubble devices, for generating the first and second clock signals; and a switching element, operatively connected to said control-signal generating circuit, said page-allocation-designating means and to receive the first and second clock signals, selecting the first and second clock signals in dependence upon the page allocation designated by said page-allocation-designating means.

6. A magnetic bubble memory system, operatively connected to receive a clock signal, comprising:

magnetic bubble devices for storing magnetic bubbles, each of said magnetic bubble devices using a page-allocation method for access in one of a single-page mode and a multi-page mode; and control means, operatively connected to said magnetic bubble devices and to receive the clock signal, for controlling transfer of magnetic bubbles in said magnetic bubble devices in dependence upon the page-allocation method designated for each of said magnetic bubble devices, comprising:

a page-allocation means for designating the page-allocation method in at least one of said magnetic bubble devices; and a single variable counting circuit, operatively connected to said page-allocation means, said magnetic bubble devices and to receive the clock signal, for supplying pulses controlling the transfer of the magnetic bubbles in each of said magnetic bubble devices in dependence upon the page-allocation method designated for each of said magnetic bubble devices.

7. A magnetic bubble memory system according to claim 6, wherein said page-allocation means comprises page-allocation designating circuits, operatively connected to said single variable counting circuit, each page-allocation designating circuit corresponding to and designating the page-allocation method for one of said magnetic bubble devices.

8. A magnetic bubble memory system according to claim 7, wherein said single variable counting circuit comprises:

a first counter, operatively connected to receive the clock signal, for generating a first control signal for control of magnetic bubble devices accessed in the single-page mode;

a second counter, operatively connected to receive the clock signal, for generating a second control signal for control of magnetic bubble devices accessed in the multi-page mode; and a switching element, operatively connected to said first and second counters, said page-allocation designating circuits and said magnetic bubble devices, for selecting one of the first and second control signals for output, as the pulses controlling the transfer of the magnetic bubbles, in dependence upon the page-allocation method designated by said page-allocation designating circuits.

9. A magnetic bubble memory system according to claim 7, wherein the clock signal includes first and second clock signals and said single variable counting circuit comprises:

a switching element, operatively connected to said page-allocation designating circuits and to receive the first and second clock signals, for selecting one of the first and second clock signals in dependence upon the page-allocation method designated by one of said page-allocation designating circuits for a corresponding magnetic bubble device; and a counter, operatively connected to said switching element and said magnetic bubble devices, for outputting the pulses controlling the transfer of magnetic bubbles in the corresponding magnetic bubble devices.

* * * * *

UNITED STATES PATENT AND TRADEMARK OFFICE
CERTIFICATE OF CORRECTION

PATENT NO. : 4,549,282

DATED : October 22, 1985

INVENTOR(S) : Takai et al.

It is certified that error appears in the above-identified patent and that said Letters Patent is hereby corrected as shown below:

```
Col. 1, line 51, "operates" should be --generates--.
Col. 3, line 19, "device art" should be --art device--.
Col. 4, line 2, "bit" should be --bits--.
Col. 5, line 13, "with" should be --via--.
Col. 6, line 52, after "from" insert --one--;
                 delete "one".
```

Signed and Sealed this

Eleventh Day of March 1986

[SEAL]

Attest:

DONALD J. QUIGG

Attesting Officer

Commissioner of Patents and Trademarks